United States Patent [19]

Bednorz et al.

[11] Patent Number: 5,240,906
[45] Date of Patent: Aug. 31, 1993

[54] ENHANCED SUPERCONDUCTING FIELD-EFFECT TRANSISTOR

[75] Inventors: Johannes G. Bednorz, Wolfhausen; Jochen D. Mannhart, Au; Carl A. Mueller, Hedingen, all of Fed. Rep. of Germany; Darrell Schlom, Menlo Park, Calif.

[73] Assignee: International Business Machines Corporation, Armonk, N.Y.

[21] Appl. No.: 864,754

[22] Filed: Apr. 7, 1992

[30] Foreign Application Priority Data

Jul. 19, 1991 [EP] European Pat. Off. ........ 91112106.9

[51] Int. Cl.$^5$ ..................... H01L 39/22; B05D 5/12; H01B 12/00
[52] U.S. Cl. ..................... 505/1; 505/701; 505/729; 257/33; 257/35; 257/39; 427/62; 427/63
[58] Field of Search ............. 357/5; 505/1, 701, 833, 505/874, 1; 257/33, 35, 39; 427/62, 63

[56] References Cited

U.S. PATENT DOCUMENTS

| | | | |
|---|---|---|---|
| 4,954,480 | 9/1990 | Imanaka et al. | 505/1 |
| 4,994,435 | 2/1991 | Shiga et al. | 505/1 |
| 5,015,620 | 5/1991 | Ekin et al. | 505/1 |
| 5,019,554 | 5/1991 | Takeshita et al. | 505/1 |
| 5,135,908 | 8/1992 | Yang et al. | 505/1 |

FOREIGN PATENT DOCUMENTS

| | | |
|---|---|---|
| 0324044 | 1/1988 | European Pat. Off. |
| 0354804 | 7/1989 | European Pat. Off. |
| 1-024476 | 1/1989 | Japan |

OTHER PUBLICATIONS

Koinuma et al, "Some Problems in the Preparation of Superconducting Oxide Films on Ceramic Substrates", *Jap. J. Appl. Phys.*, vol. 26, #5, May 1987, pp. L763-L765.

Inoue et al, "Y-Ba-Cu-O/Nb Tunnel Type Josephson Junctions", *Jap. J. Appl. Phys.*, vol. 26, #9, Sep. 1987, pp. L1443-L1444.

Chien et al, "Effect of Noble Metal Buffer Layers on Superconducting YBaCuO Thin Films", *Appl. Phys. Lett.*, vol. 51, #25, Dec. 21, 1987, pp. 2155-2157.

Hatta et al, "Pt-Coated Substrate Effect on Oxide Superconductive Films in Low-Temperature Processing", *Appl. Phys. Lett.*, vol. 53, #2, Jul. 11, 1988, pp. 148-150.

Applied Physics Letters, vol. 59, No. 26, Dec. 23, 1991, New York, U.S. pp. 3470-3472; XI, X.X, et al: "Electric Field Effect in High Tc Superconducting Ultrathin YBa2Cu3O7-x Films" pp. 3470-3471.

Zeitschrift Fur Physik B, vol. 83, No. 3, 1991, Berline, DE, pp. 307-311; Mannhart, J. et al.: "Electric Field Effect on Super-conducting YBaCu3O7-delta Films" * p. 308, paragraph 6-paragraph 7; FIG. 1* *p. 310, FIG. 6*.

Physical Review, vol. 148, No. 1, Aug. 5, 1966, New York, U.S., pp. 280-286; Ambler E. et al: "Magnetization and Critical Field of Superconducting SrTiO3" * p. 280, paragraph 1—paragraph 4*.

Workshop On High Temperature Superconducting Electron Devices, Jun. 7, 1989, Shikabe, JP, pp. 281-284; D. F. Moore, et al: "Superconducting Thin Films for Device Applications" * p. 282, para. 4—p. 283, para. 2; FIG. 2*.

Journal of Applied Physics, vol. 69, No. 8, Apr. 15, 1991, New York, U.S., pp. 4439-4441; Levy, A. et al:

(List continued on next page.)

*Primary Examiner*—Rolf Hille
*Assistant Examiner*—Mahshid Saadat
*Attorney, Agent, or Firm*—Richard Lau

[57] ABSTRACT

An inverted MISFET structure with a high transition temperature superconducting channel comprises a gate substrate, an interfacial layer with one or more elements of the VIII or IB subgroup of the periodic table of elements, an insulating layer and a high transition temperature superconducting channel. An electric field, generated by a voltage applied to its gate alters the conductivity of the channel.

15 Claims, 4 Drawing Sheets

OTHER PUBLICATIONS

"Field-Effect Conductance of YBa2Cu3O6" * p. 4439, para. 3—para 4* *p. 4440; FIG. 1*.

Article by J. Mannhart, et al., "Electric Field Effect on Superconducting YBA$_2$Cu$_3$O$_7$— Films", Zeitschrift fuer Physik B, Condensed Matter 83, pp. 307–311, 1991.

Article by H. Hasegawa, et al., "Contact between High-T$_c$ Superconductor and Semiconducting Niobium-Doped SrTiO$_3$", Japanese Journ. of Appl. Phys., vol. 28, No. 12, Dec. 1989, pp. L2210–L2212.

Article by A. T. Fiory and A. F. Hebard, "Field-Effect and Electron Density Modulation of the superconducting Transition in Composite In/InOx Thin Films", *Physica* 135B.

Article by A. T. Fiory and A. F. Hebard, "Electric Field Modulation of Low Electron Density Thin-Film superconductors", *Proc. Internat. Workshp on Novel Mechanism of Superconductivity*, Berkley, Jun. 1987.

Article by M. Gurvitch, et al., "Field Effect on Superconducting Surface Layers of SrTiO$_3$", *Material Research Society*, 1986, pp. 47–49.

Article by Bednorz and Mueller, entitled "Possible High-T$_c$ Superconductivity in the Ba–La–Cu–O System", Zeitschrift fuer Physik B, Condensed Matter, vol. B64, 1986, pp. 189–193.

Article by F. F. Fang, et al., "Superconducting Field-Effect Transistor", IBM Technical Disclosure Bulletin, vol. 19, No. 4, Sep. 1976, pp. 1461–1462.

Article by A. F. Hebard, et al., "Experimental Considerations in the Quest for a Thin-film Superconducting Field-Effect Transistor," *IEEE Trans. on Magnetics*, vol. MAG-23, No. 2.

ENHANCED SUPERCONDUCTING FIELD-EFFECT TRANSISTOR

TECHNICAL FIELD

The present invention relates generally to field-effect transistors and, more particularly, to a field-effect transistor having a structure similar to an inverted MISFET (Metal-Insulator-Semiconductor Field-Effect Transistor). The inventive field-effect transistor may be an n-channel or p-channel depletion or enhancement type. An electric field, generated by a voltage applied to the gate, alters the conductivity of the channel.

BACKGROUND OF THE INVENTION

Based on the new class of superconductors as described in the article by Bednorz and Mueller, entitled "Possible High-$T_c$ Superconductivity in the Ba-La-Cu-O System", Zeitschrift fuer Physik B, Condensed Matter, Vol. B64, 1986, p. 189-193, different field-effect transistor (FET) structures have been developed and published using a high $T_c$ (transition temperature) superconductors. FET structures with superconducting channels have been described in the following articles: "Superconducting Field-Effect Transistor" by F. F. Fang et al., IBM Technical Disclosure Bulletin, Vol. 19, No. 4, September 1976, pp. 1461-1462, and "Experimental Considerations In the Quest for a Thin-Film Superconducting Field-Effect Transistor" by A. F. Hebard et al., IEEE Trans. on Magnetics, Vol. MAG-23, No. 2, March 1987, pp. 1279-1282. In these articles, structures are described with a superconducting channel having a thickness of about 10 nm. An electric field generated by applying a voltage between a gate electrode and the superconductor causes a slight change in carrier density in a thin surface layer of the superconductor. This change in carrier density in turn results in a shift in $T_c$ in the thin layer. By applying signals to the gate, the thin layer can be switched between "superconducting" and "normal conducting" states. This results in a change in the channel resistance.

Since the field induced effect does not extend deeply into the channel material, various approaches to enhance the magnitude of the effect have been published by A. T. Fiory and A. F. Hebard in the following two articles: "Field-Effect and Electron Density Modulation of the Superconducting Transition in Composite In/InOx Thin Films", Physica 135B, 1985, pp. 124-127, North-Holland, Amsterdam, and "Electric Field Modulation of Low Electron Density Thin-Film Superconductors", Proc. Internat. Workshop on Novel Mechanism of Superconductivity, Berkley, June 1987. The first cited article of Fiory and Hebard relates to the fabrication and measurement of a superconducting MISFET. Another article on this subject, relating to a field effect in strontium titanate, has been published by M. Gurvitch et al. "Field Effect on Superconducting Surface Layers of $SrTiO_3$", Materials Research Society, 1986, pp. 47-49.

The disadvantages of these surface effect devices is that the change in channel resistance is quite small. Even in the switched thin surface layer the change is only from metallic conductivity to superconductivity and, in addition, the bulk section of the channel, not being affected by the applied field, acts as a metal shunt parallel to the thin surface layer. Therefore, the output signals are too small to be able to drive FET devices. Another drawback is that the field induced change in $T_c$ is rather small, i.e., operating temperature, $T_{op}$, requirements are stringent. The reason for this drawback is that in order to operate properly, the $T_c$ of the thin layer has to be shifted from a value above $T_{op}$ to a value below $T_{op}$.

Another field-effect transistor is described in European Patent Application EP-A 0 324 044, "A Field-Effect Device with a Superconducting Channel". The channel of this device is about 1 nm thick and consists of a high-$T_c$ metal-oxide superconductor. Since the channel is extremely thin, it can be affected by an electric field without leaving a metal shunt. With a few volts applied to the gate, the entire channel is depleted of charge carriers whereby the channel resistance can be switched between "zero" (undepleted, superconducting) and "high" (depleted). Unfortunately, studies of such devices have shown that, in the suggested configuration, the ultrathin superconducting layers readily degrade during deposition of the insulating layer and the top electrode.

The problem of degradation during the deposition of insulator and electrode can also be avoided by changing the structure in such a manner that the superconducting film is deposited after the insulating layer, and the gate electrode is located underneath the insulator and the superconductor. An exemplary cross-section of such an inverted MISFET is shown in FIG. 1. The gate electrode 10 consists of a conducting niobium-doped strontium titanate, the insulating layer 11 consists of undoped strontium titanate and the current channel 12, which is grown on top of this layer 11, consists of $YBa_2CU_3O_{7-\delta}$. Source and drain contacts 13, 14 are situated at the upper surface of the current channel 12 and the gate metalization is fixed at the niobium-doped strontium titanate substrate 10.

Measurements with these and similar structures have shown lower capacitances between gate and source ($C_{GS}$) than theoretically expected. In addition only a few percent resistivity modulation was observed. The fact that the performance of the device, is influenced by some degradation at the surface of the doped $SrTiO_3$ has been published in the article "Electric Field Effect on Superconducting $YBa_2Cu_3O_{7-\delta}$ Films", by J. Mannhart et al., Zeitschrift fuer Physik B, Condensed Matter 83, pp. 307-311, 1991.

Additionally, measurements of the resistivity and the capacitance of known inverted MISFETs with high-$T_c$ superconducting channel have shown drawbacks of these devices. Such drawbacks seem to be caused by a degradation at the surface of the Nb-doped strontium titanate. Similar effects have been observed and reported by H. Hasegawa et al. in their article "Contact between High-$T_c$ Superconductor and Semiconducting Niobium-Doped $SrTiO_3$, Japanese Journ. of Appl. Phys., Vol. 28, No. 12, December 1989, pp. L2210-L2212. The authors interpreted their measurement of an Er-Ba-Cu-O thin film superconductor deposited on a Nb-doped $SrTiO_3$ substrate as an indicator that there are unknown interfacial layers between the high-$T_c$ superconductor layer and the substrate. Further investigations and measurements have shown that a degradation of the doped $SrTiO_3$ reduces its conductivity and lowers the dielectric constant of the insulating layer. A low dielectric constant of the insulating layer of a field-effect transistor has a negative influence on several parameters of these devices. For example, the change in drain current, resulting from the applied field, the output admittance, and the transconductance are proportional to the dielectric constant of this insulator.

SUMMARY OF THE INVENTION

One object of this invention is to overcome the above-described deficiencies of superconducting FET's by providing an improved structure for an inverted MISFET with high- $T_c$ superconducting channel.

Another object of the present invention is to provide an inverted MISFET with high- $T_c$ superconducting channel having an increased capacitance between gate and source.

A further object is to improve the resistivity modulation of an inverted MISFET.

It is another object of this invention to provide a method for making an inverted MISFET with high- $T_c$ superconducting channel and enhanced performance.

In order to accomplish the above and other objects of the invention, a gate electrode is prevented from degradating by depositing an interfacial layer between the gate electrode and the insulating layer.

The interfacial layer comprises one or more elements of the VIII subgroup or the IB subgroup of the Periodic Table of Elements, and is deposited prior to deposition of the insulating layer. With the addition of this interfacial layer, the capacitance between gate and source ($C_{GS}$) is improved by three-fold. In addition, more than one order of magnitude improvement in resistivity modulation is achieved.

BRIEF DESCRIPTION OF THE DRAWINGS

These and other objects, features, aspects and advantages will be more readily apparent and better understood from the following detailed description of the invention, in which.

DETAILED DESCRIPTION OF THE PREFERRED EMBODIMENTS

Before describing the embodiments of the present invention in greater detail, some aspects of different materials being used and the meaning of expressions used hereinafter are explained.

Figure 1:
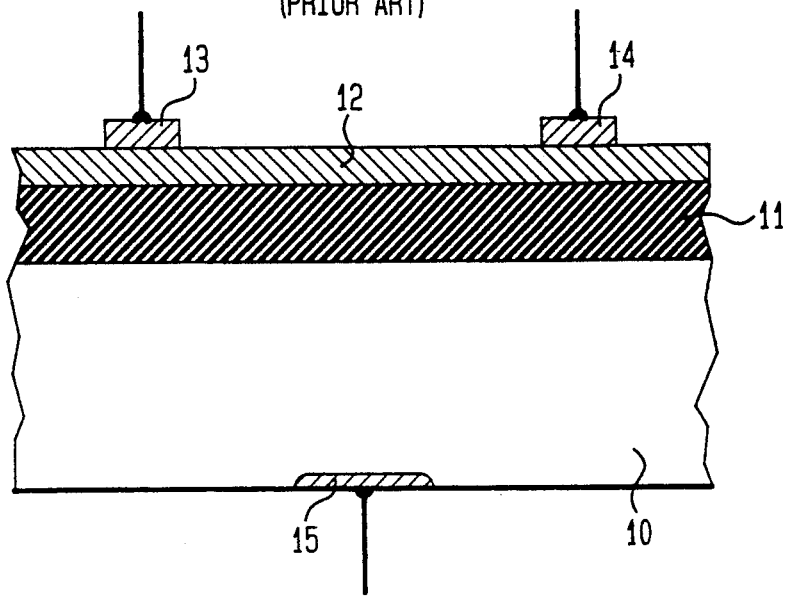
FIG. 1 is a cross-sectional view of an inverted MISFET with high-$T_c$ superconducting channel (Prior Art)
Figure 2:
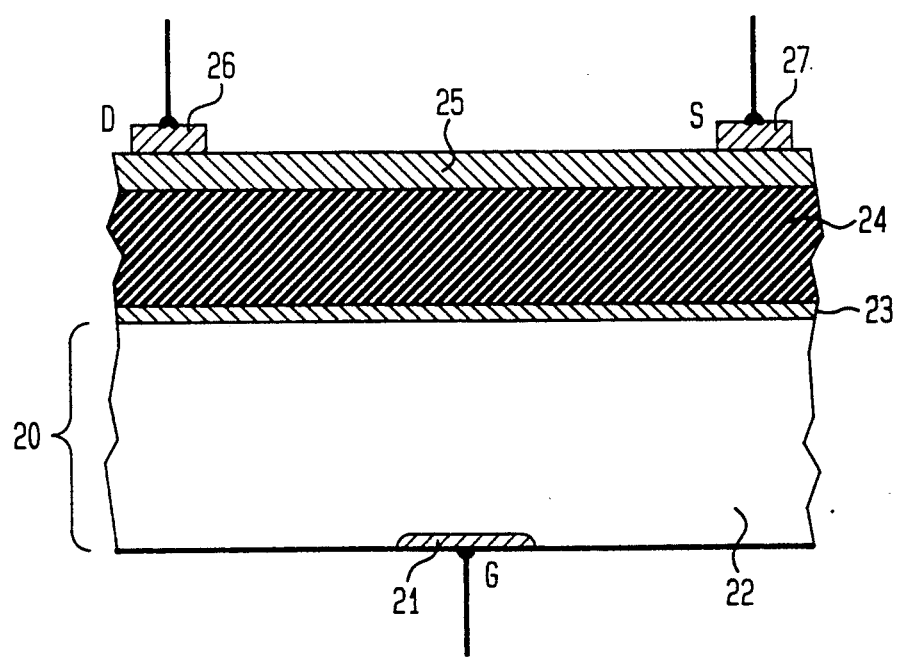
FIG. 2 is a cross-sectional view of an inverted MISFET with high-$T_c$ superconducting channel and interfacial layer according to the present invention.

As shown in FIG. 2, the inventive MISFET comprises a gate electrode 20 having a contact metallization 21 and a substrate 22. An additional layer 23 is situated between the gate electrode 20 and an insulating layer 24. A superconducting current channel 25 is formed on top of the insulating layer 24. The drain contact 26 and source contact 27 are disposed on the current channel 25.

The materials used to form substrate 22, insulating layer 24, and superconducting current channel 25, are preferably chosen from the same crystallographic family, that is, all having the same perovskite structure. The lattice constants of the materials chosen should at least approximately match. In a preferred embodiment, the layers herein used have a mismatch below about 20%. The mismatch m is defined by equation (1):

$$m = \left| \frac{(a_1 - a_0)}{a_0} \right| \quad (1)$$

wherein $a_0$ is the lattice constant of the "substrate" and $a_1$ is the lattice constant of the following layer. The materials used for the substrate and the insulating layer are taken from the group of perovskites and related compounds. For example, the perovskites form a family of compounds having a crystal structure similar to that of the mineral perovskite, $CaTiO_3$. Some of these compounds with perovskite structure are listed below. Their lattice constants and the dimensions of the perovskite subcells are given in the following list.

| Compound | Lattice constants | | | Dimensions of subcell | | |
|---|---|---|---|---|---|---|
| | a/Å | b/Å | c/Å | $a_s$/Å | $b_s$/Å | $c_s$/Å |
| $CaTiO_3$ | 5,381 | 5,443 | 7,645 | 3,827 | 3,827 | 3,823 |
| $KTaO_3$ | 3,9885 | | | 3,9885 | | |
| $LaAlO_3$ | 5,357 | | | 3,791 | | |
| $La_2CuO_4$ | 5,36 | 5,41 | 13,17 | 3,81 | 3,81 | 13,17 |
| $LaGaO_3$ | 5,496 | 5,524 | 7,787 | 3,896 | 3,896 | 3,894 |
| $NdGaO_3$ | 5,426 | 5,502 | 7,706 | 3,864 | 3,864 | 3,853 |
| $PrGaO_3$ | 5,465 | 5,495 | 7,729 | 3,875 | 3,875 | 3,865 |
| $Sr_2RuO_4$ | 3,870 | 3,870 | 12,74 | 3,870 | 3,870 | 12,74 |
| $SrTiO_3$ | 3,905 | | | 3,905 | | |

Many more perovskites and related compounds are listed in the book "Numerical Data and Functional Relationships in Science and Technology", Landolt-Boernstein, Group III: Crystal and Solid State Physics, Volume 4, Part a, Springer-Verlag. To make a substrate having these compounds conductive, it has to be doped with appropriate dopants. Strontium titanate ($SrTiO_3$) for example, is an insulator. By doping it with niobium (Nb) it becomes electrically conducting. This niobium doped compound with perovskite structure is hereinafter referred to as $Nb:SrTiO_3$.

The surface of this substrate degrades during the deposition of the insulating layer and the high-$T_c$ superconducting channel. This degradation is caused by the oxidizing environment used for these deposition steps. The degraded and insulating surface of the substrate results in a lowering of the capacitance between gate and source ($C_{GS}$) of the inverted MISFET structure.

By adding an interfacial layer 23 having elements of the VIII subgroup or the IB subgroup of the periodic table of elements, the performance of the inverted MISFET can be improved. With this additional layer 23 between substrate 22 and insulating layer 24, as illustrated in FIG. 2, a three-fold improvement of the capacitance $C_{GS}$ and more than an order of magnitude improvement in resistivity modulation may be observed. The chosen material for this interfacial layer 23 should be highly conductive, resistant to oxidation and have a lattice constant and thermal expansion coefficient approximately equal to that of the substrate 22 and insulating layer 24. Besides satisfying these requirements of structural compatibility, it is also desirable to have a chemically compatible material which does not, for example, react with or otherwise destroy the properties of the insulating or superconducting layers. In addition, the compounds with perovskite structure and the one or more elements of the interfacial layer 23 should be chosen such that epitaxy occurs. One favorable parameter is the lattice constant and the dimensions of the subcells $a_s$, $b_s$, $c_s$ as shown in the list of perovskites and related compounds.

Examples of materials that satisfy some of these requirements are the elements from the subgroups VIII and IB of the Periodic Table of Elements and their alloys. The utilization of semiconductors replacing these metals or alloys is conceivable. Pt, Rh, Pd, Ag, Au and their alloys can be used. By using an alloy of these elements the lattice constant can be varied by controlling the composition of the elements. For example, the lattice constant of Pt-Rh alloys can be varied between 3,804 Å. (pure Rh) and 3,924 Å. (pure Pt). This ability allows for an even better lattice match to the surrounding layers to be obtained. The appropriate alloy composition yielding roughly the desired lattice constant can be calculated from Vegard's law given below.

Vegard's Law: For two components A and B having the same crystal structure and for which a substitutional solid solution exists, the lattice constant, $a_{mixture}$, of a mixture containing x atomic % A and $(1-x)$ atomic % B is approximately given by:

$$a_{mixture} \simeq x\, a_A + (1-x) a_B \qquad (2)$$

where $a_A$ is the lattice constant of pure A and a sub B is the lattice constant of pure B. Details of this law are described in an article of L. Vegard published in Zeitschrift fuer Physik, Vol. 5, 1921, p. 17. Deviations from Vegard's law are investigated in the book "Structure of Metals, Crystallographic Methods, Principles and Data", Third Revised Edition, of C. S. Barrett et al., Pergamon Press 1980.

The lattice constants of some elements of the Periodic Table of Elements are listed below:

| Element | Lattice constant $a_o$/Å |
| --- | --- |
| Ag | 4,086 |
| Au | 4,079 |
| Ir | 3,839 |
| Pd | 3,891 |
| Pt | 3,924 |
| Rh | 3,804 |

The binary phase diagrams of the different alloys are published in the book "Binary Alloy Phase Diagrams", Volumes 1 and 2, American Society for Metals, Ohio USA. These diagrams show if an alloy can be produced and if a corresponding substitutional solid solution exists.

One embodiment according to the present invention is shown FIG. 2. In this example, the compound with perovskite structure, strontium titanate, $SrTiO_3$, has been chosen, and the substrate 22 is doped with niobium (Nb), in particular a single crystal doped with 0.05% Nb and (100) oriented. An interfacial layer 23 of platinum (Pt) is situated on top of the substrate 22. The thickness of this layer is about 4 nm. The insulating layer 24, comprising undoped $SrTiO_3$ has a thickness of about 500 nm. The layer 24 is followed by the superconducting channel 25 comprising of $YBa_2CU_3O_{7-\delta}$ of about 7 nm. Gold (Au) contact pads 26 and 27, used as source and drain contacts, are situated on top of the channel 25. The gate contact 21 may comprise silver (Ag).

Figure 3:
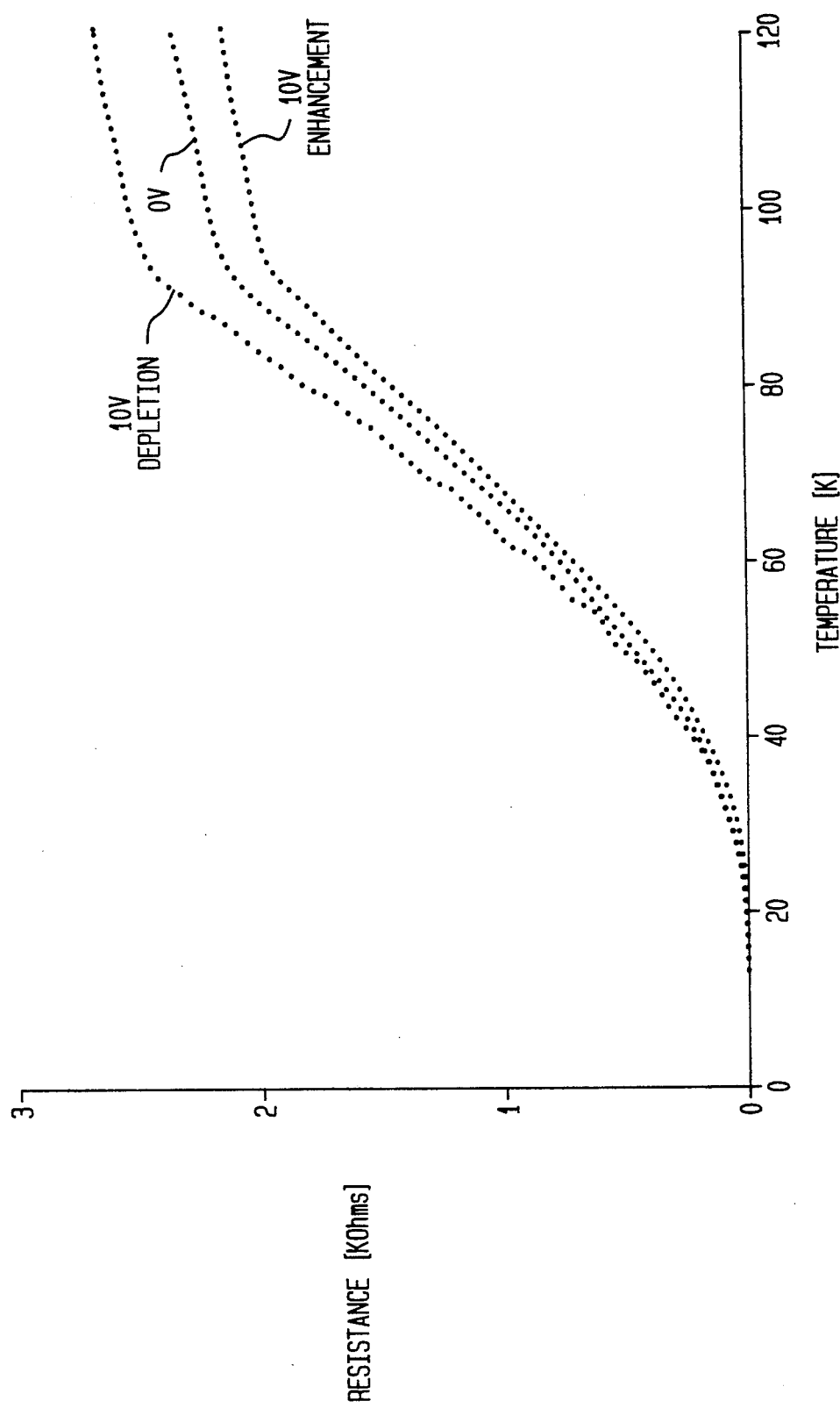
FIG. 3 shows resistance vs. temperature curves, of an embodiment of the described inverted MISFET with high-$T_c$ superconducting channel and enhanced performance.
Figure 4:
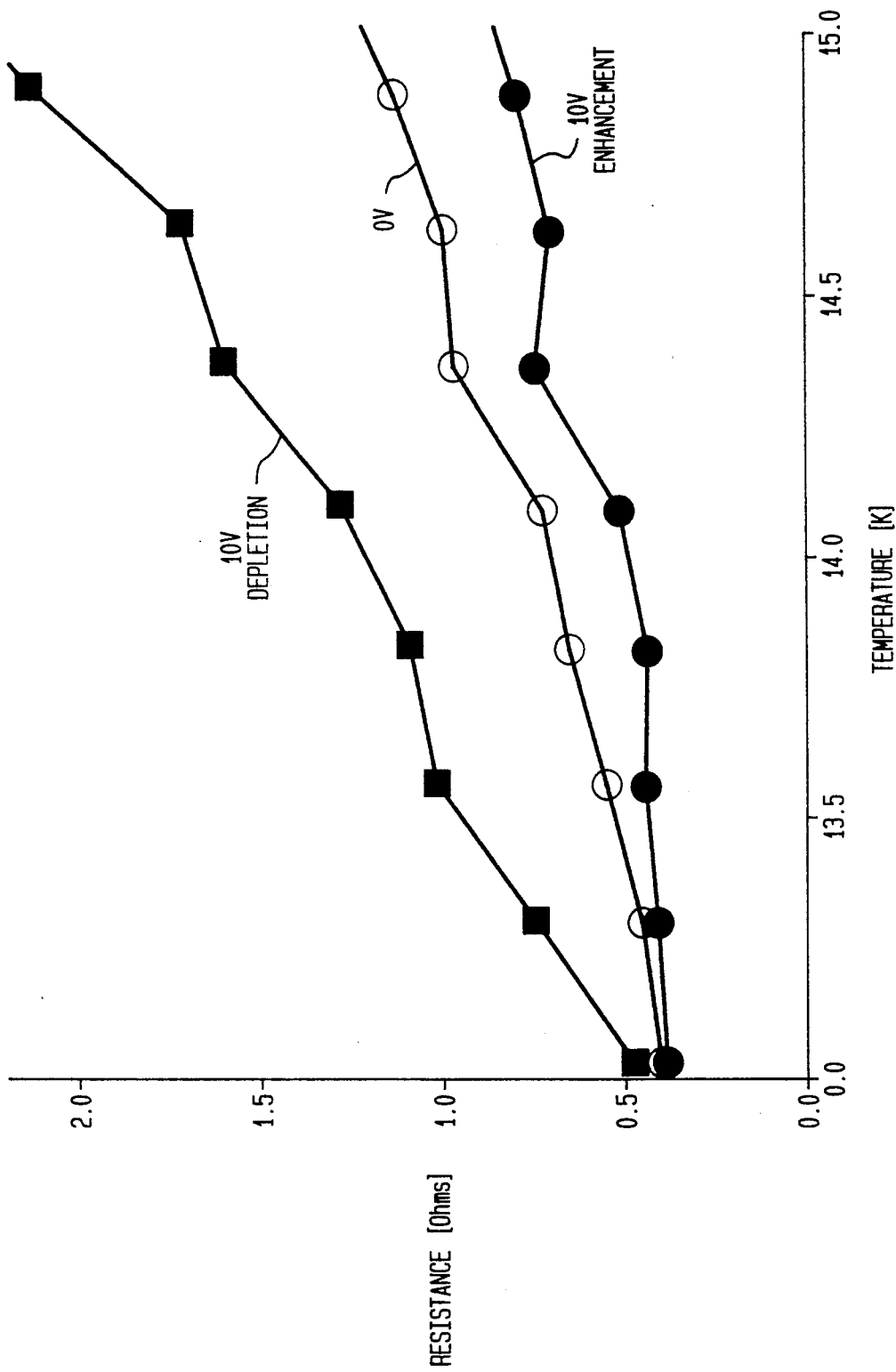
FIG. 4 shows additional resistance vs. temperature curves of an embodiment of the described inverted MISFET with high-$T_c$ superconducting channel and enhanced performance.

Measurements of this device showed an improvement of its performance in comparison to similar devices without Pt-layers. As shown in FIG. 3 and FIG. 4, the $YBa_2CU_3O_{7-\delta}$ film is superconducting below $\simeq 14$ K ($T \simeq 14$ K). The resistance vs. temperature is shown in these FIGS., with gate voltage, $V_G$, as a parameter. FIG. 4 shows resistance vs. temperature curves, with gate voltage as a parameter in the region of the superconducting transition (the temperature range being from 13 K to 15 K).

Different experiments and measurements have shown that a thin Pt layer improves the surface quality of the substrate 22. Due to the good lattice match between Pt and $SrTiO_3$, the Pt layer can be grown epitaxially on the substrate. The mismatch m, as defined in equation (1) is:

$$m = \left| \frac{3,924 - 3,905}{3,905} \right| \approx 0.005$$

The effective dielectric constant $\epsilon_i$ of the $SrTiO_3$ insulating layer 24 has been found to be greater than 100 at 300 K in comparison to $\epsilon_i \approx 40$ in a comparable structure without Pt layer 23. As expected, a substantial increase in device sensitivity is achieved. The resistivity modulation for example increased more than an order of magnitude.

It was noted, however, that in addition to the beneficial effect of Pt diffusion into the dead surface layer of the Nb doped substrate 22, that Pt diffusion through the undoped $SrTiO_3$ layer 24 into the $YBa_2Cu_3O_{7-\delta}$ superconducting channel 25 does occur during deposition of the insulator and superconductor. This results in a broadening of the superconducting transition. For this reason, best results are achievable employing thin interfacial layers and thick insulating layers. Interfacial layers with a thickness of 1 Å up to 100 Å, and insulating layers with a thickness of several thousand angstroms can be used. By lowering the processing temperatures after the deposition of the interfacial layer, further improvements in device performance is possible.

Advantageously, the interfacial Pt layer improves the properties of the substrate and the entire device. Some reasons for choosing Pt are as follows: it is highly conductive, it is resistant to oxidation during further processing steps in the oxygen ambient, and its lattice mismatch is about 0.5%. In addition, platinum is chemically compatible with the compounds with perovskite structure utilized.

The fabrication of an inverted MISFET with high-$T_c$ superconducting channel and interfacial Pt layer will now be described. The processing steps after deposition of the Pt layer are critical because high temperatures stimulate the diffusion of Pt. The gate electrode 20 of the inverted MISFET includes a conducting n-type (0.05% Nb doped) $SrTiO_3$ (100) single crystal substrate 22 which is grown by, for example, the float-zone technique. The substrate 22 is heated to about 600° C. and a thin epitaxial layer 23 of platinum is deposited, for example by electron-beam evaporation. The sample is then transferred to a radio frequency (RF) magnetron sputtering chamber and about 500 nm of undoped $SrTiO_3$ is deposited at a substrate temperature of about 680° C. in a 0.05 Torr argon-oxygen ambient with Ar:$O_2 = 2:1$. Without leaving the vacuum environment, the sample is transferred to a direct current (DC) magnetron sputtering chamber where about 80 Å of $YBa_2Cu_3O_{7-\delta}$ is deposited at a substrate temperature of about 750° C. and with a pressure of 0.65 Torr (Ar:$O_2 = 2:1$). The sample is then cooled down in a 400 Torr $O_2$ ambient and removed from the vacuum chamber. Using conventional photolitography and wet etching steps, the sample is patterned and gold contact pads 26, 27 are formed on the source and drain contacts. The gate contact 21 (to the back side of the conducting substrate 22) is made, for example, using silver paint.

This embodiment can be modified by variations of the thickness of the layers and by using other compounds with perovskite structure, interfacial layer and contact materials, and by employing other high- $T_c$ metal-oxide superconductors. In addition, the arrangement of the contacts can be changed as desired.

Figure 5:
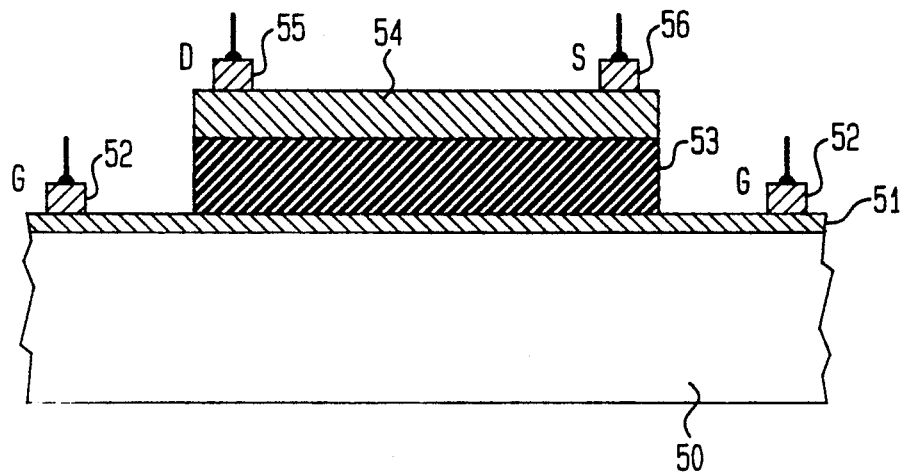
FIG. 5 is a cross-sectional view of another inverted MISFET with superconducting channel and interfacial layer, according to the present invention.

Another embodiment is illustrated in FIG. 5. The substrate 50 comprises an undoped compound with perovskite structure. An interfacial layer 51 is deposited on the substrate 50, and a gate contact 52 is fabricated by a subsequent processing step. On top of this interfacial layer 51, an insulating layer 53 is situated and a high- $T_c$ metal-oxide superconductor 54 is deposited thereon. An exemplary arrangement of source and drain contact pads 55, 56 is shown in this FIGURE. This embodiment has the advantage that all contacts are accessible from the top of the device and that, by patterning the interfacial layer 51, the gates of many devices present on the same substrate may be individually controlled. This is advantageous in particular for the packaging of three-terminal devices. If a high aspect ratio of the gate contact is required, the deposited contact 52 can be used as plating base for the electrodeposition of a thicker contact structure or a recess may be etched into the substrate before the growth of the overlying layers.

Figure 6:
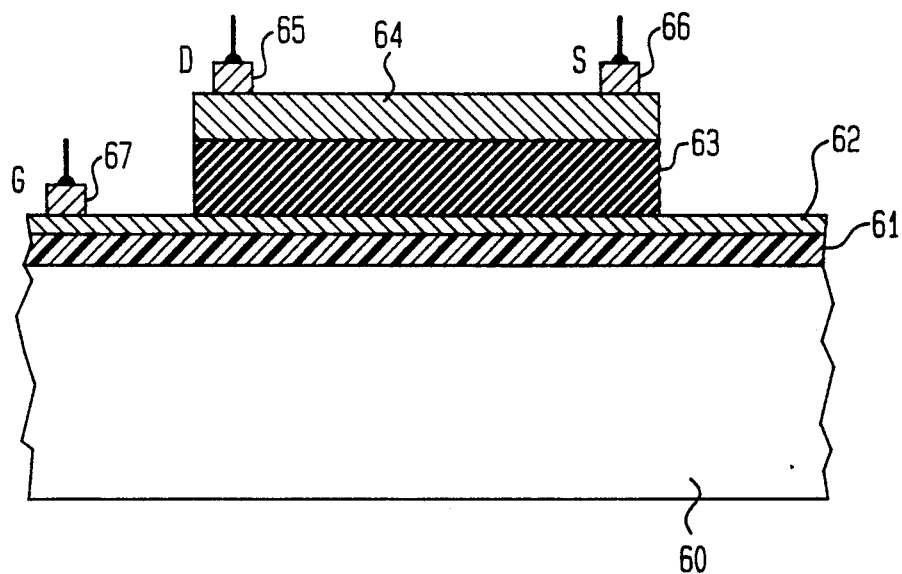
FIG. 6 is a cross-sectional view of another inverted MISFET with superconducting channel and interfacial layer, according to the present invention.

Another embodiment of the present invention is illustrated in FIG. 6. The substrate 60 comprises an undoped compound having a perovskite structure. A doped compound 61 also having a perovskite structure is situated on top of the substrate 60. An interfacial layer 62 is deposited on this doped compound. An insulating layer 63 followed by a high-$T_c$ superconducting channel 64 is deposited on top of the interfacial layer 62. Drain and source contact pads 65 and 66 are placed on the channel 64 and a gate contact 67 is fixed at the interfacial layer 62. This embodiment can be important for the integration of multiple devices on one substrate.

The embodiments described hereinabove are examples of how to implement the interfacial layer to improve the performance of inverted MISFETs with high- $T_c$ superconducting channels. In addition, MISFETs with heterostructures are conceivable and may comprise, in accordance with the present invention, high-$T_c$ metal—oxide superconductor/ perovskite—related compound multilayers grown on top of an interfacial layer which is situated on a conducting substrate.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

We claim:

1. A field-effect transistor, comprising:
   a substrate layer having gate contact electrode disposed thereon;
   an additional layer having a thickness of less than 100 Å, and being diffused into and disposed on said substrate layer;
   an insulating layer being disposed on said additional layer, said additional layer being an interface between said substrate layer and said insulating layer so as to allow for epitaxy therebetween; and
   a high transition temperature superconducting current channel layer being disposed on said insulating layer, and having a source contact electrode and a drain contact electrode disposed thereon.

2. A field-effect-transistor according to claim 1, wherein said additional layer comprises an element of the VIII subgroup of the Periodic Table of Elements.

3. A field-effect-transistor according to claim 2, wherein said element comprises a noble metal.

4. A field-effect-transistor according to claim 1, wherein said additional layer comprises an element of the IB subgroup of the Periodic Table of Elements.

5. A field-effect-transistor according to claim 4, wherein said element is a noble metal.

6. A field-effect-transistor according to claim 1, wherein said additional layer comprises a combination of the elements of the VIII subgroup and the IB subgroup of the Periodic Table of Elements.

7. A field-effect-transistor according to claim 1, wherein the thickness of said additional layer is between 10 Å and 50 Å.

8. A field-effect transistor according to claim 1, wherein said substrate layer is at least partly covered by said additional layer.

9. A field-effect transistor according to claim 6, wherein said additional layer has a lattice constant which is approximately equal to the lattice constants of the substrate layer and insulating layer.

10. A field-effect-transistor according to claim 1, wherein said substrate layer comprises a compound with a perovskite structure.

11. A field-effect transistor according to claim 10, wherein said compound having a perovskite structure comprises niobium-doped strontium titanate said additional layer comprises a noble metal having approximately the same lattice constant as said niobium-doped strontium titanate, said insulating layer comprises strontium titanate, and said superconducting channel comprises $YBa_2Cu_3O_{7-\delta}$.

12. A field-effect transistor according to claim 11, wherein said strontium titanate is doped with a doping factor of between 0.01% and 10%, and wherein said noble metal is platinum.

13. A field-effect-transistor according to claim 1, wherein said insulating layer comprises a compound with a perovskite structure.

14. A field-effect-transistor according to claim 1, wherein said high-$T_c$ superconducting current channel layer comprises a compound with a perovskite structure.

15. A field-effect-transistor according to claim 1, wherein said substrate layer, said insulating layer and said high-$T_c$ superconducting current channel layer each comprise a compound having the same perovskite structure.

* * * * *